(12) United States Patent  (10) Patent No.: US 7,951,725 B2
Lu et al.  (45) Date of Patent: May 31, 2011

(54) MANUFACTURING METHOD OF TRANSLUCENT SOLAR CELL

(75) Inventors: Chun-Hsiung Lu, Houli Township, Taichung County (TW); Chien-Chung Bi, Houli Township, Taichung County (TW)

(73) Assignee: Nexpower Technology Corp., Taichung County (TW)

(*) Notice: Subject to any disclaimer, the term of this patent is extended or adjusted under 35 U.S.C. 154(b) by 73 days.

(21) Appl. No.: 12/558,963

(22) Filed: Sep. 14, 2009

(65) Prior Publication Data

US 2010/0068849 A1 Mar. 18, 2010

(30) Foreign Application Priority Data

Sep. 16, 2008 (TW) ................................ 97135409 A (51) Int. Cl.
*H01L 21/302* (2006.01)
*H01L 21/461* (2006.01)

(52) U.S. Cl. . 438/753; 438/719; 438/746; 257/E21.006; 257/E21.028; 257/E21.058; 257/E21.134; 257/E21.189; 257/E21.288; 257/E21.352

(58) Field of Classification Search .................. 438/753, 438/719, 746, 728, 732, 785, 786, 311, 608, 438/637; 257/E21.006, E21.028, E21.058, E21.134, E21.189, E21.288, E21.352

See application file for complete search history.

(56) References Cited

U.S. PATENT DOCUMENTS

| 4,663,495 | A | 5/1987 | Berman et al. |
|---|---|---|---|
| 4,795,500 | A * | 1/1989 | Kishi et al. ..................... 136/244 |
| 5,254,179 | A | 10/1993 | Ricaud et al. |
| 6,858,461 | B2 * | 2/2005 | Oswald et al. .................. 438/68 |
| 7,098,395 | B2 | 8/2006 | Hiraishi et al. |
| 2006/0112987 | A1 | 6/2006 | Nakata et al. |
| 2006/0196536 | A1 | 9/2006 | Fujioka et al. |

* cited by examiner

*Primary Examiner* — David Nhu
(74) *Attorney, Agent, or Firm* — Ming Chow; Sinorica, LLC (57) ABSTRACT

A translucent solar cell and a manufacturing method thereof are provided. The translucent solar cell at least includes a substrate, a front electrode layer, a photoconductive layer, and a back electrode layer stacked in order. Therein, a plurality of apertures are formed on the front electrode layer. In addition, a plurality of light-transmissive regions are formed on the back electrode layer and further extended in a depth direction so as to reach the plurality of apertures on the front electrode layer. Thus, the projected area of each light-transmissive region is within and smaller than that of the corresponding aperture.

18 Claims, 7 Drawing Sheets

MANUFACTURING METHOD OF TRANSLUCENT SOLAR CELL

CROSS-REFERENCES TO RELATED APPLICATIONS

The current application claims a foreign priority to a patent application in Taiwan with serial number 097135409 filed on Sep. 16, 2008.

BACKGROUND OF THE INVENTION

1. Technical Field

The present invention relates to a translucent solar cell and, more particularly, to a translucent solar cell enhanced in light transmissivity and configured to prevent short-circuiting during the manufacturing process.

2. Description of Related Art

Figure 1A:
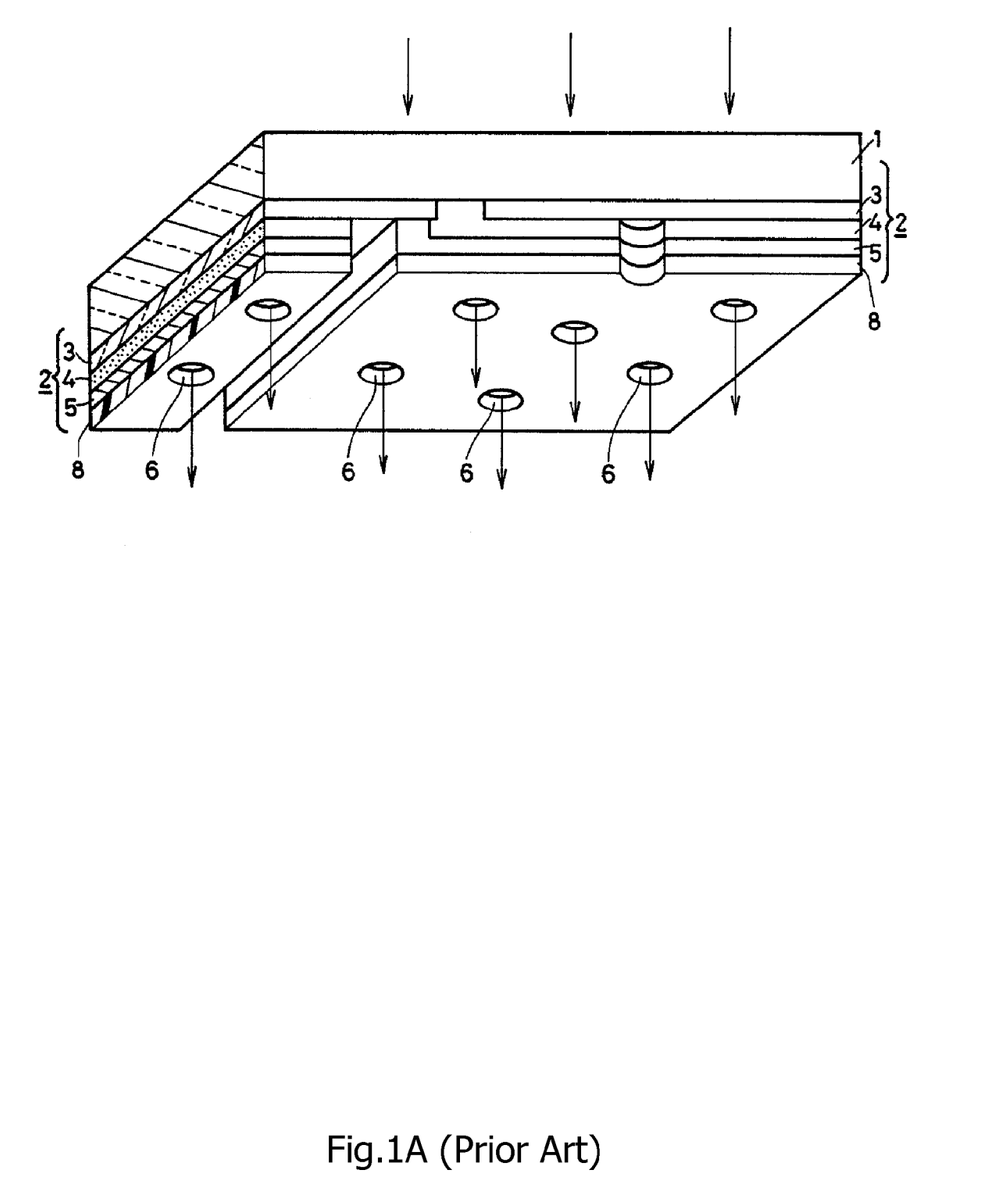
FIG. 1A is a perspective view of a conventional translucent solar cell.

A thin-film solar cell is manufactured by depositing various films on a substrate and then laser-scribing the films so as to form discrete and series-connected unit cells. More specifically, a front electrode layer, a photoconductive layer, and a back electrode layer are deposited sequentially on the substrate. In the prior art of thin-film solar cells, U.S. Pat. No. 4,795,500 discloses a solar cell shown in FIG. 1A, wherein the solar cell includes a substrate 1, a photoelectric conversion element 2 (composed of a front electrode layer 3, a photoactive layer 4, and a back electrode layer 5), and a resist layer 8. To make this solar cell, the resist layer 8 is used as a photo mask, and a plurality of light-transmissive regions 6 are formed as desired through an etching process.

Figure 1B:
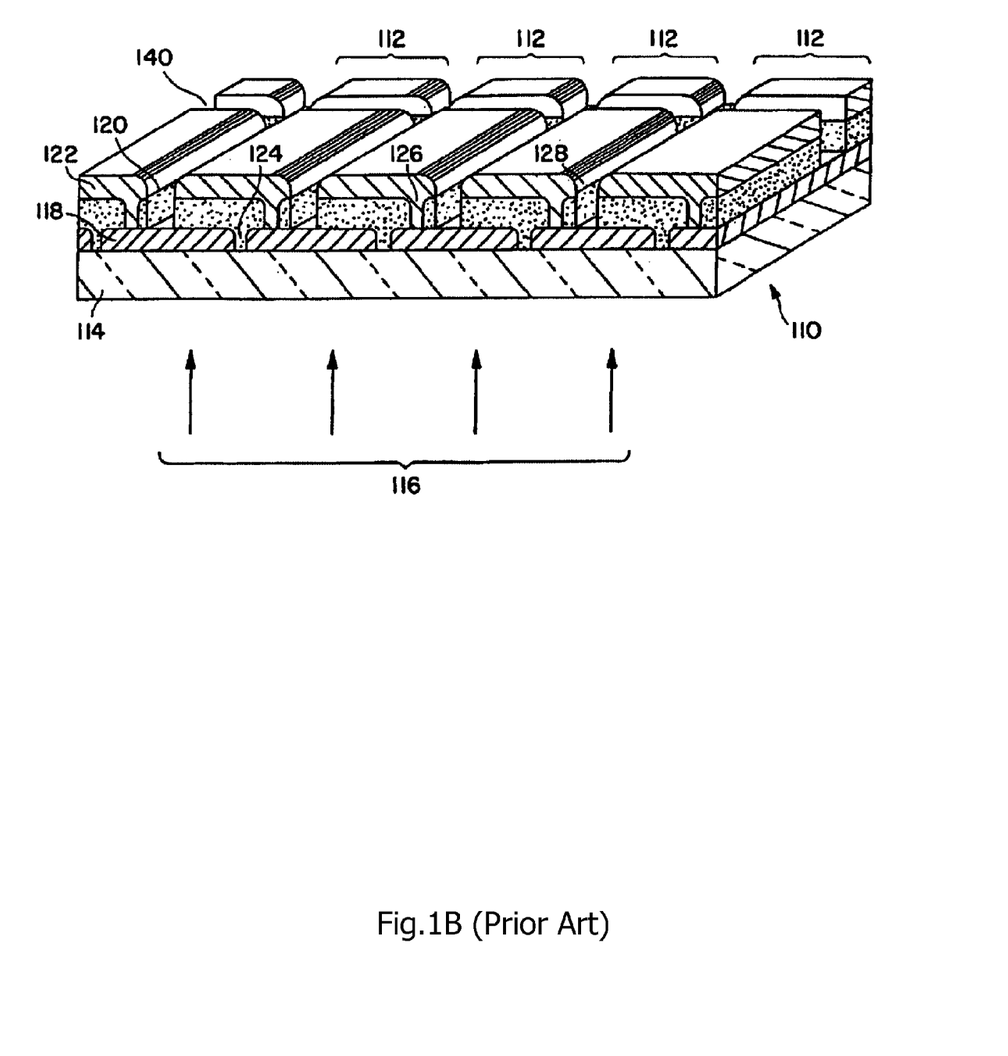
FIG. 1B is a perspective view of another conventional translucent solar cell.
Figure 1C:
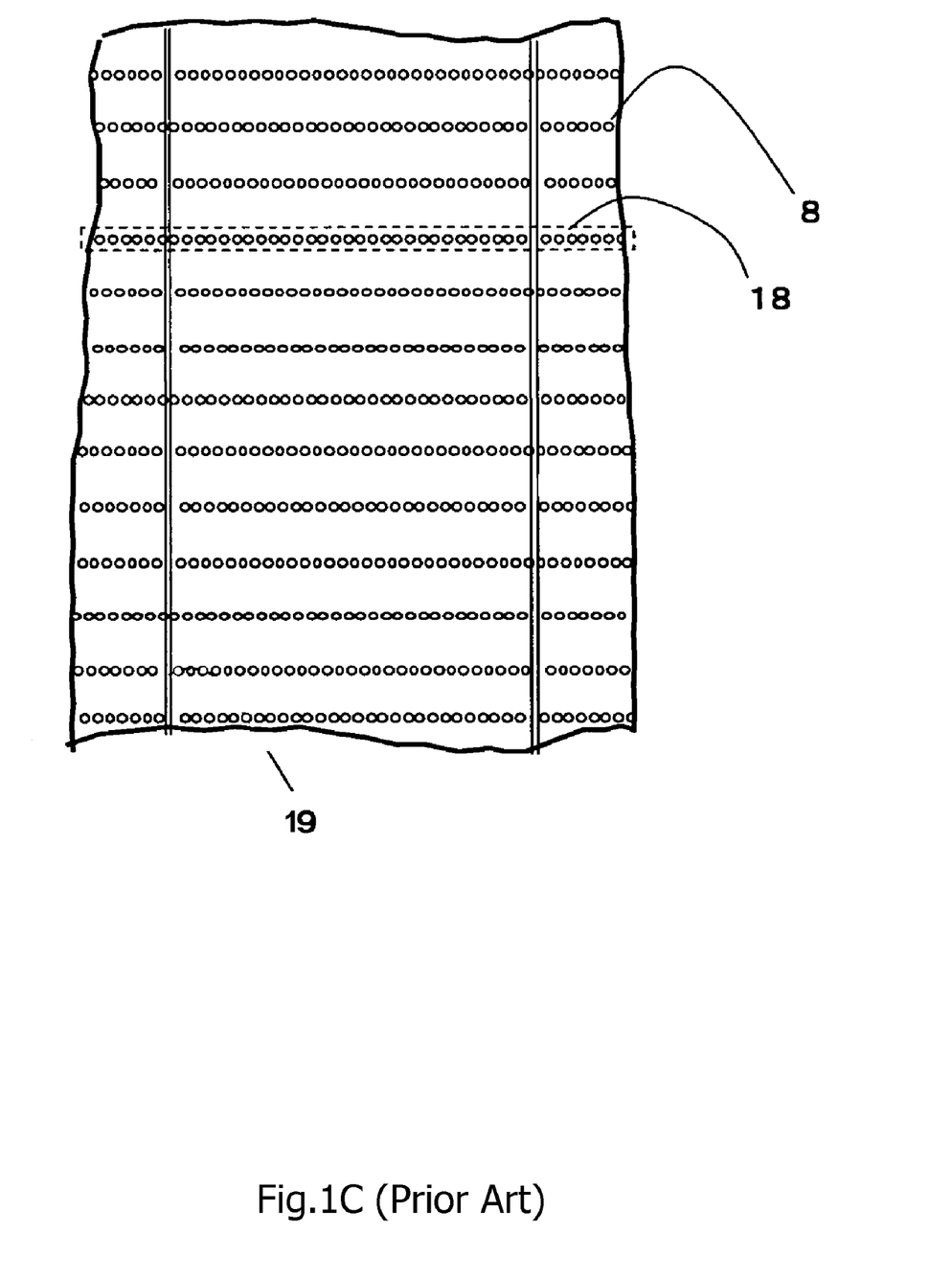
FIG. 1C is a perspective view of yet another conventional translucent solar cell.

U.S. Pat. No. 6,858,461 teaches another solar cell, as shown in FIG. 1B. The solar cell, indicated by the reference numeral 110 in FIG. 1B, includes a substrate 114, a front electrode layer 118, a photoactive layer 120, and a back electrode layer 122. The solar cell 110 is laser-scribed to form scribe lines 124 perpendicular to the grooves 128 dividing the solar cell 110 into discrete and series-connected unit cells 112. Then, the metallic back electrode layer 122 is partially removed to form light-transmissive regions which allow the passage of light emitted from a light source 116, thus creating translucency. In addition, US Patent Publication No. 2006/0112987 discloses yet another solar cell, as shown in FIG. 1C, wherein a multitude of holes 8 are formed by partially removing a back electrode layer or a photoconductive layer with laser. These holes 8 provide the solar cell module 19 with a plurality of light-transmissive regions 18 that render the entire solar cell module 19 translucent.

In order to allow the passage of light and achieve translucency, the above-cited thin-film solar cells are formed with a plurality of light-transmissive regions. However, while the light-transmissive regions are formed, i.e., while the films are partially removed by laser or by an etching process so as to create holes or scribe lines on the films, a thermal effect tends to take place upon cutting the films, such that the portions of the films that are supposed to be cut off to form the holes or the scribe lines are not completely removed. As a result, the conductive layers are bridged and cause short circuits.

BRIEF SUMMARY OF THE INVENTION

To overcome the aforesaid shortcomings of the prior art, the present invention provides a translucent solar cell which at least includes a substrate, a front electrode layer, a photoconductive layer, and a back electrode layer stacked in order. Therein, a plurality of apertures are formed on the front electrode layer. In addition, a plurality of light-transmissive regions are formed on the back electrode layer and further extended in a depth direction so as to reach the apertures on the front electrode layer. Thus, each of the light-transmissive regions has a projected area that is located within and smaller than that of a corresponding one of the apertures.

Therefore, a primary objective of the present invention is to provide a translucent solar cell, wherein an aperture is formed on a front electrode layer, and subsequently a light-transmissive region is formed and further extended in a depth direction so as to reach the aperture on the front electrode layer, thus preventing the various films of the translucent solar cell from short-circuiting.

A secondary objective of the present invention is to provide a translucent solar cell, wherein light-transmissive holes of arbitrary shapes are formed by means of laser and a photo mask, thereby reducing production costs.

Another objective of the present invention is to provide a translucent solar cell, wherein the projected shapes of light-transmissive regions can be changed as appropriate to increase overall light transmissivity.

Yet another objective of the present invention is to provide a manufacturing method of a translucent solar cell, wherein an aperture is formed on a front electrode layer, and subsequently a light-transmissive region is formed and further extended in a depth direction so as to reach the aperture on the front electrode layer, thus preventing the various films of the translucent solar cell from short-circuiting.

Still another objective of the present invention is to provide a manufacturing method of a translucent solar cell, wherein light-transmissive holes of arbitrary shapes are formed by means of laser and a photo mask, thereby reducing production costs.

A further objective of the present invention is to provide a manufacturing method of a translucent solar cell, wherein the projected shapes of light-transmissive regions can be changed as appropriate to increase overall light transmissivity.

BRIEF DESCRIPTION OF THE SEVERAL VIEWS OF THE DRAWINGS

The invention as well as a preferred mode of use, further objectives, and advantages thereof will be best understood by referring to the following detailed description of an illustrative embodiment in conjunction with the accompanying drawings, wherein.

DETAILED DESCRIPTION OF THE INVENTION

The present invention provides a translucent solar cell, wherein the principle of photoelectric conversion by solar cells is well known to a person of ordinary skill in the art and therefore will not be detailed herein. Besides, it is to be understood that the drawings referred to in the following description are intended to demonstrate features of the present invention only schematically, so the drawings are not necessarily drawn to scale.

Figure 2A:
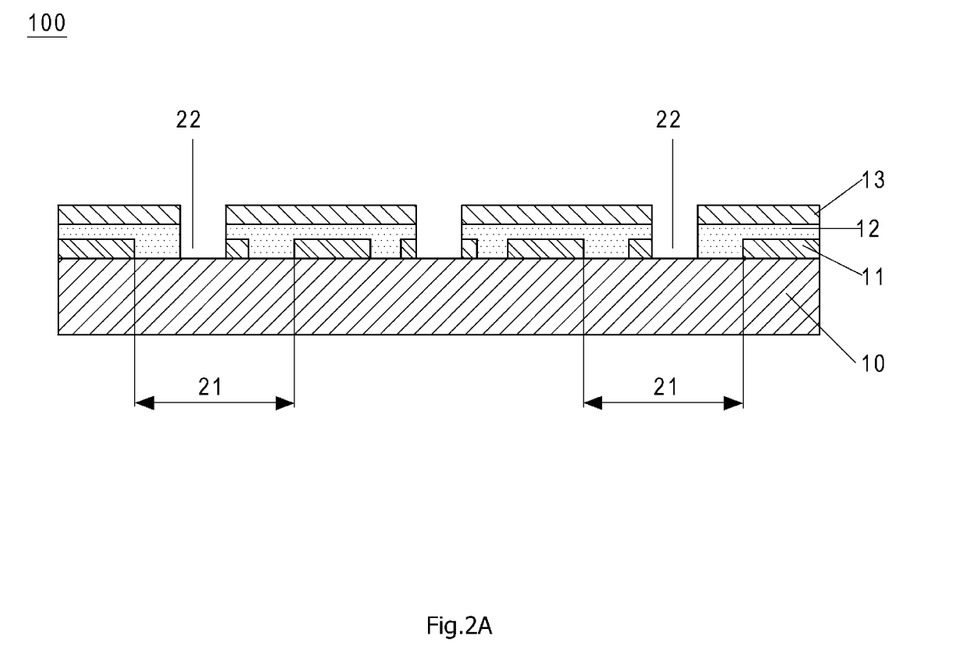
FIG. 2A is a side sectional view of a translucent solar cell according to a first preferred embodiment of the present invention.

Referring to FIG. 2A, a translucent solar cell 100 according to a first preferred embodiment of the present invention at least includes a substrate 10, a front electrode layer 11, a photoconductive layer 12, and a back electrode layer 13 stacked in that order.

Figure 2B:
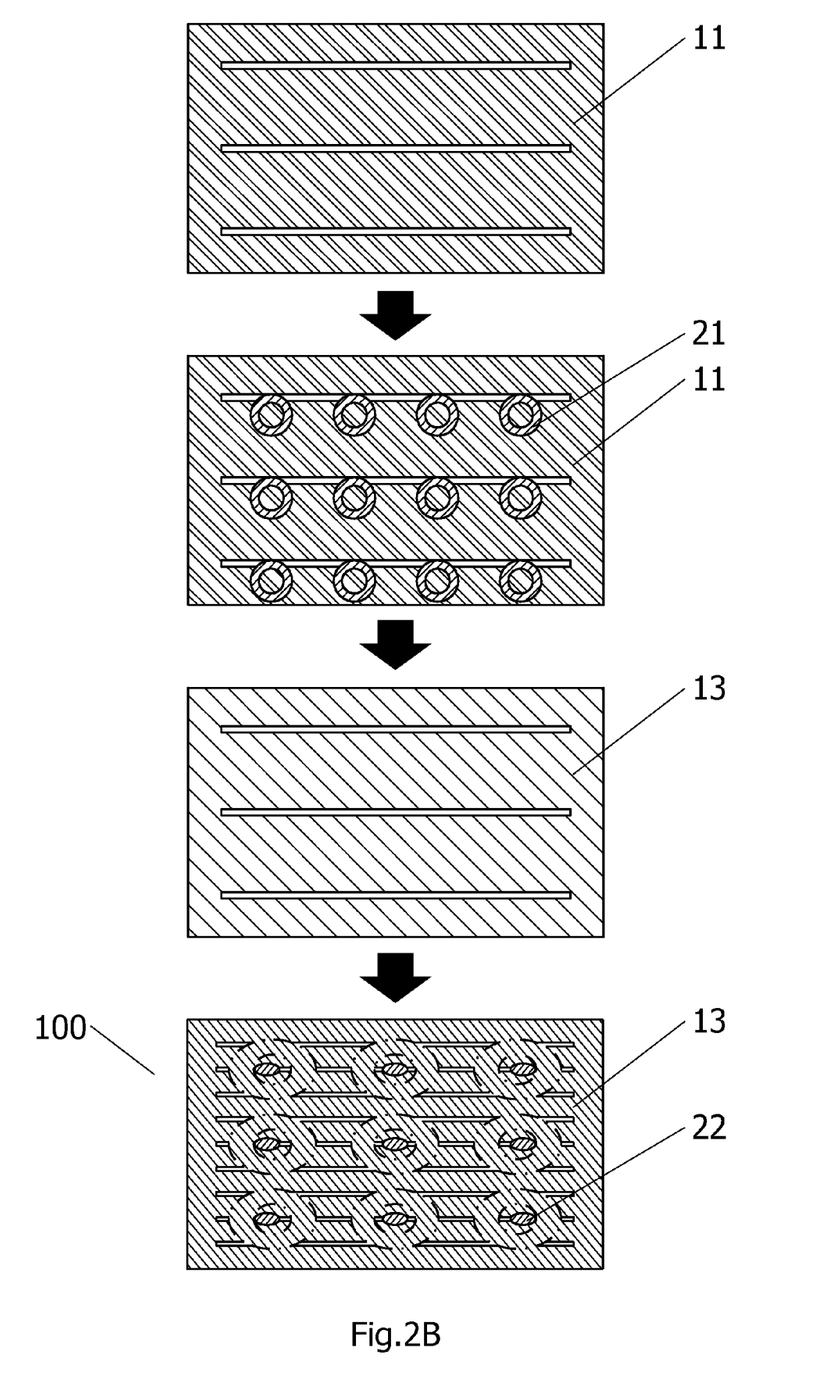
FIG. 2B is a flowchart of a method for manufacturing the translucent solar cell according to the first preferred embodiment of the present invention.
Figure 2C:
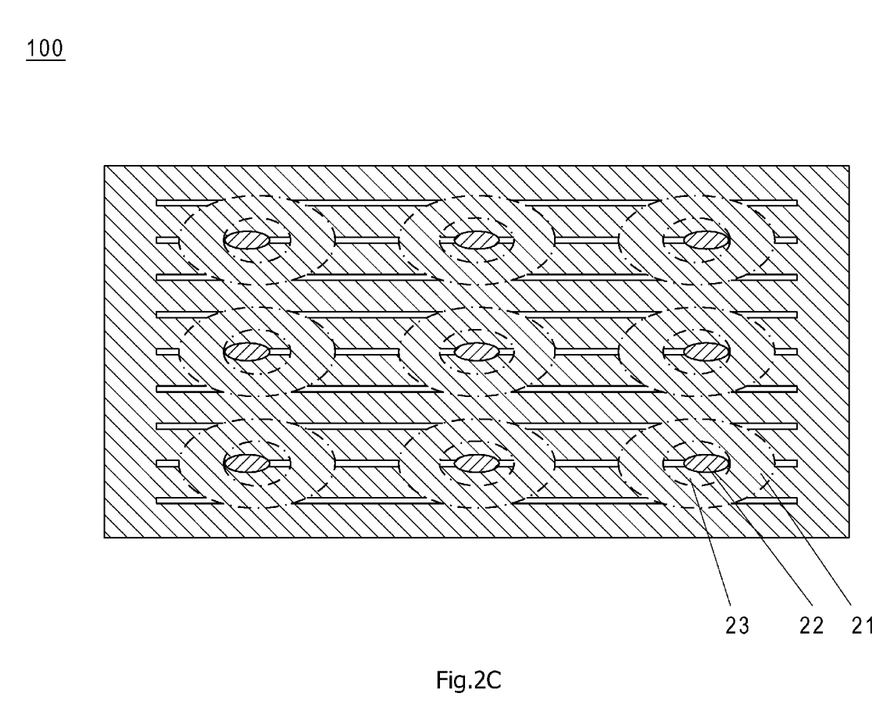
FIG. 2C is a schematic drawing of the translucent solar cell according to the first preferred embodiment of the present invention.
Figure 2D:
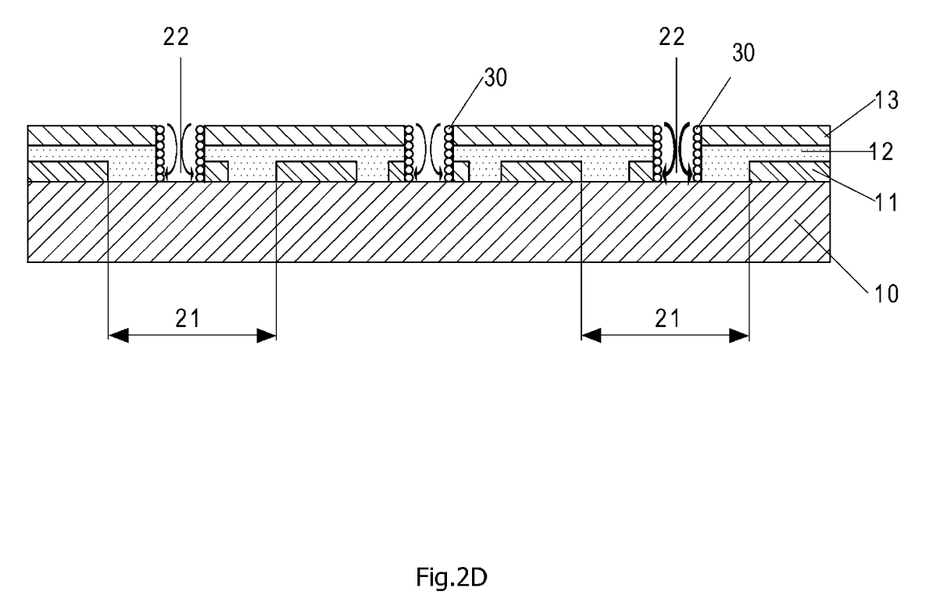
FIG. 2D is another side sectional view of the translucent solar cell according to the first preferred embodiment of the present invention.

Please refer to FIG. 2B for a flowchart of a manufacturing method of the translucent solar cell 100. To begin with, the front electrode layer 11 is deposited on the substrate 10. Then, after a photo mask (not shown) is placed on the front electrode layer 11, a laser beam is projected through the photo mask to form a plurality of apertures 21 on the front electrode layer 11. Following that, the photoconductive layer 12 and the back electrode layer 13 are successively deposited. Next, the laser beam is projected again so as to penetrate the back electrode layer 13 and go further in a depth direction until the laser beam reaches the apertures 21 on the front electrode layer 11, thereby forming a plurality of light-transmissive regions 22. The finished translucent solar cell 100 is illustrated in FIG. 2C. It should be noted that each of the light-transmissive regions 22 has a projected area which is located within and is smaller than the projected area of a corresponding one of the apertures 21. Thus, each of the apertures 21 is centrally formed with a shielding region 23 that makes the corresponding light-transmissive region 22 look like an annular configuration. Preferably, the apertures 21 are orderly arranged as an array or as a pattern of a specific shape. Besides, the projected shape of each of the apertures 21 can be strip-like, rectangular, polygonal, circular, elliptical, arcuate, or irregular. Moreover, referring to FIG. 2D, during the manufacturing process of the translucent solar cell 100, scribe lines 30 are generally formed when the films are cut. The scribe lines 30 tend to conduct current from the back electrode layer 13 to the front electrode layer 11 such that the back electrode layer 13 and the front electrode layer 11 are bridged and short-circuited. With the present invention, however, such bridging and short-circuiting can be prevented.

Generally, the substrate 10 is made of a transparent material. The front electrode layer 11 is a single-layer or multi-layer transparent conductive oxide (TCO) selected from tin dioxide ($SnO_2$), indium tin oxide (ITO), zinc oxide (ZnO), aluminum-doped zinc oxide (AZO), gallium-doped zinc oxide (GZO), and indium zinc oxide (IZO). The photoconductive layer 12 has a single-layer or multi-layer structure and is made of a crystalline silicon semiconductor, an amorphous silicon semiconductor, a semiconductor compound, an organic semiconductor, or a sensitized dye. The back electrode layer 13 has a single-layer or multi-layer structure and includes a metal layer made of silver (Ag), aluminum (Al), chromium (Cr), titanium (Ti), nickel (Ni), or gold (Au). The back electrode layer 13 further includes a transparent conductive oxide selected from tin dioxide, indium tin oxide, zinc oxide, aluminum-doped zinc oxide, gallium-doped zinc oxide, and indium zinc oxide.

A second preferred embodiment of the present invention is a manufacturing method of a translucent solar cell. The manufacturing method includes the steps of:

(1) providing a substrate 10;
(2) forming a front electrode layer 11 on the substrate 10;
(3) providing at least one photo mask;
(4) providing a laser beam that is projected through the at least one photo mask so as to partially remove the front electrode layer 11 and thereby form a plurality of apertures 21;
(5) forming a photoconductive layer 12 on the front electrode layer 11;
(6) forming a back electrode layer 13 on the photoconductive layer 12;
(7) providing the laser beam through the at least one photo mask such that the laser beam extends from the back electrode layer 13 to the apertures 21 and thus partially removes the back electrode layer 13, the photoconductive layer 12, and the front electrode layer 11, thereby forming a plurality of light-transmissive regions 22, wherein each of the light-transmissive regions 22 has a projected area located within a corresponding one of the apertures 21; and
(8) forming a shielding region 23 at a central portion of each of the apertures 21.

In the aforesaid manufacturing method, the substrate 10, the front electrode layer 11, the photoconductive layer 12, the back electrode layer 13, the apertures 21, the light-transmissive regions 22, and the shielding regions 21 are similar in material and structure to their counterparts in the first preferred embodiment.

The present invention is herein described by reference to the preferred embodiments, and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A manufacturing method of a translucent solar cell, comprising:
   providing a substrate;
   forming a front electrode layer on said substrate;
   providing at least one photo mask;
   providing a laser beam projected through the at least one photo mask so as to partially remove the front electrode layer, thereby forming a plurality of apertures;
   forming at least one photoconductive layer on said front electrode layer;
   forming a back electrode layer on said at least one photoconductive layer;
   providing a laser beam through the at least one photo mask such that the laser beam extends from the back electrode layer to the plurality of apertures and thus partially removes the back electrode layer, the photoconductive layer, and the front electrode layer, thereby forming a plurality of light-transmissive regions, wherein each said light-transmissive region has a projected area located within a corresponding one of the apertures; and
   forming a shielding region at a central portion of each said aperture.

2. The manufacturing method of a translucent solar cell according to claim 1, wherein the projected area of each said light-transmissive region is smaller than a projected area of the corresponding one of the apertures.

3. The manufacturing method of a translucent solar cell according to claim 1, wherein the shielding region formed at the central portion of each said aperture such that said light-transmissive region looks like an annular configuration.

4. The manufacturing method of a translucent solar cell according to claim 1, wherein each said aperture has a projected shape selected from the group consisting of a strip-like shape, a rectangular shape, a polygonal shape, a circular shape, and an elliptical shape.

5. The manufacturing method of a translucent solar cell according to claim 1, wherein each said aperture has a projected shape selected from the group consisting of an arcuate shape and an irregular shape.

6. The manufacturing method of a translucent solar cell according to claim 1, wherein the plurality of apertures are orderly arranged as an array.

7. The manufacturing method of a translucent solar cell according to claim 1, wherein the plurality of apertures are so arranged as to form a pattern of a specific shape.

8. The manufacturing method of a translucent solar cell according to claim 1, wherein the substrate is made of a transparent material.

9. The manufacturing method of a translucent solar cell according to claim 1, wherein the front electrode layer has a single-layer structure.

10. The manufacturing method of a translucent solar cell according to claim 1, wherein the front electrode layer has a multi-layer structure.

11. The manufacturing method of a translucent solar cell according to claim 1, wherein the front electrode layer comprises a transparent conductive oxide selected from the group consisting of tin dioxide, indium tin oxide, zinc oxide, aluminum-doped zinc oxide, gallium-doped zinc oxide, and indium zinc oxide.

12. The manufacturing method of a translucent solar cell according to claim 1, wherein the photoconductive layer has a single-layer structure.

13. The manufacturing method of a translucent solar cell according to claim 1, wherein the photoconductive layer has a multi-layer structure.

14. The manufacturing method of a translucent solar cell according to claim 1, wherein the photoconductive layer is made of a material selected from the group consisting of a crystalline silicon semiconductor, an amorphous silicon semiconductor, a semiconductor compound, an organic semiconductor, and a sensitized dye.

15. The manufacturing method of a translucent solar cell according to claim 1, wherein the back electrode layer has a single-layer structure.

16. The manufacturing method of a translucent solar cell according to claim 1, wherein the back electrode layer has a multi-layer structure.

17. The manufacturing method of a translucent solar cell according to claim 1, wherein the back electrode layer comprises a metal layer made of a material selected from the group consisting of silver, aluminum, chromium, titanium, nickel, and gold.

18. The manufacturing method of a translucent solar cell according to claim 1, wherein the back electrode layer comprises a transparent conductive oxide selected from the group consisting of tin dioxide, indium tin oxide, zinc oxide, aluminum-doped zinc oxide, gallium-doped zinc oxide, and indium zinc oxide.

\* \* \* \* \*